United States Patent
Pohland et al.

(10) Patent No.: US 6,596,466 B1
(45) Date of Patent: Jul. 22, 2003

(54) CONTACT STRUCTURE AND METHOD OF FORMING A CONTACT STRUCTURE

(75) Inventors: Oliver Pohland, Sunnyvale, CA (US); Kaichiu Wong, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/491,044

(22) Filed: Jan. 25, 2000

(51) Int. Cl.[7] .............................. G03F 9/00; G03F 7/36; G03F 7/20
(52) U.S. Cl. ........................ 430/313; 430/311; 430/5; 716/19; 716/20; 716/21
(58) Field of Search ........................... 430/5, 311, 313; 716/19, 20, 21

(56) References Cited

U.S. PATENT DOCUMENTS

| | | | |
|---|---|---|---|
| 4,716,131 A | * 12/1987 | Okazawa et al. | 437/200 |
| 4,814,244 A | 3/1989 | Koguchi et al. | |
| 4,895,780 A | 1/1990 | Nissan-Cohen et al. | |
| 4,951,112 A | * 8/1990 | Choi et al. | 357/41 |
| 5,057,462 A | 10/1991 | Eisenberg et al. | |
| 5,208,124 A | 5/1993 | Sporon-Fiedler et al. | |
| 5,242,770 A | 9/1993 | Chen et al. | |
| 5,340,700 A | 8/1994 | Chen et al. | |
| 5,553,273 A | 9/1996 | Liebmann | |
| 5,572,461 A | * 11/1996 | Gonzalez | 365/156 |
| 5,663,893 A | * 9/1997 | Wampler et al. | 364/491 |
| 5,707,765 A | 1/1998 | Chen | |
| 5,825,070 A | 10/1998 | Bryant et al. | |
| 6,044,007 A | * 3/2000 | Capodieci | 365/120 |

OTHER PUBLICATIONS

Chen et al., "Practical i–Line OPC Contact Masks for Sub–0.3 Micron Design Rule Application: Part 1—OPC Design Optimization," *Interface '97 Conference Proceedings*, Nov. 1997, pp. 1–23.

Ueshima et al., "A 5–$\mu m^2$ Full CMOS Cell for High–Speed SRAMs Utilizing a Optical–Proximity–Effect Correction (OPC) Technology," *1996 Symposium on VLSI Technology Digest of Technical Papers*, 1996, pp. 146–147.

* cited by examiner

Primary Examiner—Janet Baxter
Assistant Examiner—Sin J. Lee
(74) Attorney, Agent, or Firm—Bradley T. Sako (57) ABSTRACT

Contact structures, methods for forming contact structures, and masks for forming contact structures are disclosed. According to one embodiment a contact hole (208) may be formed with a contact hole mask (106/106') that may have a generally rectangular shape and include corner extensions (108-0 to 108-3) and side indents (110-0 to 110-3). A long side of a contact hole (208) may be aligned in the same direction as an active area (204). A contact hole (208) may be situated between a first portion (206-0) and a second portion (206-1) of an intermediate structure (206). Alternate embodiments can include a "cactus" shaped intermediate structure (406) that may be formed with an intermediate structure mask having corner indents (308).

11 Claims, 8 Drawing Sheets

CONTACT STRUCTURE AND METHOD OF FORMING A CONTACT STRUCTURE

TECHNICAL FIELD

The present invention relates generally to the fabrication of semiconductor devices, and more particularly the formation of contact structures in a semiconductor device.

BACKGROUND OF THE INVENTION

Integrated circuits can typically include various layers of conductive, semiconductive, and/or insulating materials. For example, an integrated circuit may include a substrate in which a number of active devices (such as transistors) may be formed. Gates for insulated gate field effect transistors may be formed from a deposited semiconductor material. Such active devices. may then be connected to one another by one or more conductive or semiconductive layers. The interconnecting conducting layers may be separated from one another by insulating layers.

Insulating layers typically provide electrical isolation between conductive and/or semiconductive layers. Conductive or semiconductive layers may be formed from a single layer of material, or alternatively, include one or more conductive (or semiconductive) materials.

Different conductive or semiconductive layers can be connected to one another by contacts and/or vias. Contacts and/or vias can include contact holes that extend through one or more insulating layers. Conventionally, contacts can connect a substrate to a conductive or semiconductive layer, while a via can connect two different conductive or semiconductive layers to one another.

Layers may be patterned by lithography and etch steps. For example, a lithography step can form an interconnect etch mask over a conductive and/or semiconductive layer. An etch step can then transfer the interconnect etch mask pattern to the conductive and/or semiconductive layer. A lithography step can also form a contact hole etch mask over an insulating layer. An etch step can then form a contact hole through the insulating layer.

One concern with certain contact structures can be the alignment of a contact with a lower conductive and/or semiconductive layer. Because a contact can be formed by etching a hole through an insulating layer to an underlying conductive or semiconductive layer, it is desirable for the etched hole to be situated directly over the desired contact location in the lower conducting layer. However, because the sizes of features in modern integrated circuits can be so small, some misalignment can be inherent in a manufacturing process.

Another concern with certain contact structures can be the alignment of an intermediate layer with respect to an underlying layer. As but one example, a contact hole may have to be formed adjacent to, or overlap, a transistor gate layer. In the event such a gate is misaligned with respect to an underlying layer, the available area exposed by a contact hole can be reduced.

Yet another concern with certain contact structures can be variations in the dimensions of an intermediate layer. As but one example, a transistor gate layer may have a certain critical dimension (CD) range. In the event such a gate layer is at the high end of such a range, the gate layer may cover more available contact area than nominal or low CD ranges. This can be exacerbated by complex gate structure shapes. Many times, complex gate structure shapes can contribute to increasing the compactness of a circuit.

A number of examples will now be described to further illustrate the effect of misalignment and CD variations on the formation of certain contacts.

Figure 10A:
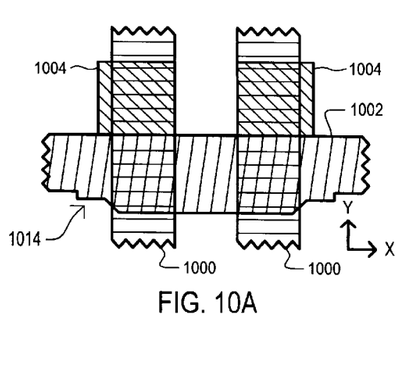
FIGS. 10A and 10B show one example of conventional masks for forming a contact hole and a corresponding structure.
Figures 10B, 12A:
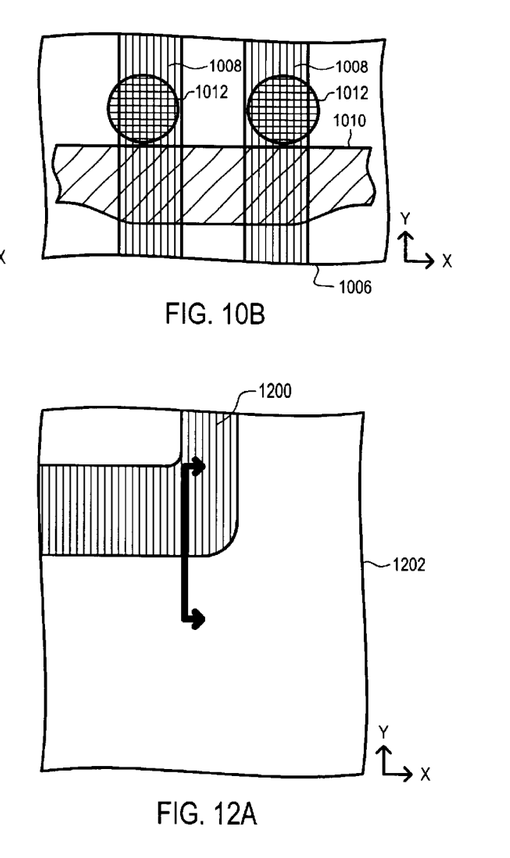
FIGS. 12A to 12C shows a method of forming a structure according to the masks of FIG. W.

FIGS. 10A and 10B are top plan views showing an example of a conventional mask set and a corresponding contact formation method. In particular, FIG. 10A shows three overlapping mask patterns, each distinguished by a particular hatching pattern.

A first mask is an "active" mask 1000. An active mask 1000 can be used to form an "active" area in a substrate. For example, an active mask 1000 can be used to form isolation structures, such as shallow trench isolation (STI) structures or those formed with local oxidation of silicon (LOCOS) methods.

A second mask can be a gate mask 1002. A gate mask 1002 can be used form a gate layer pattern over an active area. A gate mask 1002 may pattern a layer that forms the gate of a transistor. Such a layer may inherently connect two or more transistor gates and/or connect a transistor gate to the substrate (by a "buried" contact or another such contact).

FIG. 10A also includes a contact hole mask 1004. A contact hole mask 1004 can be used to form a contact hole to a substrate. (or another conductive layer). The particular contact hole mask 1004 of FIG. 10A can be for a "self-aligned" contact. A self-aligned contact may eliminate a minimum spacing requirement from a gate mask 1002.

FIGS. 10A and 10B also include a direction indicator that shows a Y direction and an X direction. The Y and X directions are perpendicular to one another.

FIG. 10B shows an example of a semiconductor device that can be formed with the masks of FIG. 10A. FIG. 10B shows a substrate 1006 that can include active areas 1008 formed therein. A gate layer structure 1010 may be formed on a substrate 1006 and over portions of active areas 1008. It is noted that a misalignment of the gate layer structure 1010 with respect to the contact hole mask 1004 in the positive Y direction can reduce overall available contact area, as a resulting gate layer structure 1010 can extend into a contact hole 1012 location.

Variations in gate layer structure 1010 CDs can also impact contact area. For example, a gate layer structure 1010 with a high CD can extend into a contact hole location, reducing contact area.

Misalignment between a contact hole mask 1004 and active areas 1008 can also impact contact area. In the example of FIGS. 10A and 10B, a misalignment of a contact hole mask 1004 with respect to an active area 1008 in the positive or negative X direction can reduce overall available contact area, as a resulting contact hole 1012 can overlap isolation regions in a substrate 1006.

FIGS. 10A and 10B also show one example of how a mask pattern transfers to an underlying device structure. For example, while a contact hole mask 1004 may have a square shape, "edge" and/or "corner" lithography and etch effects can give rise to a resulting contact hole 1012 with a circular shape. Further, while a gate mask 1002 may include sharp stepped features, such as those shown as item 1014 in FIG. 10A, such features can be smoothed out in a lithography and etch step, resulting in a more gradually contoured structure, such as the gate layer structure 1010 of FIG. 10B.

Figure 11:
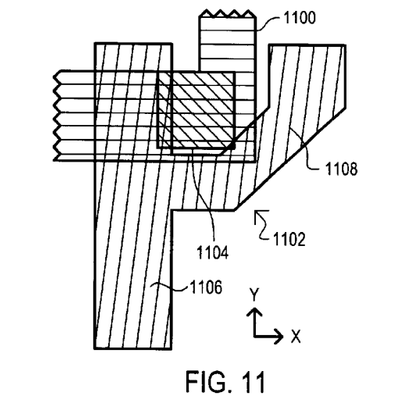
FIG. 11 shows one example of conventional masks for forming a cactus contact hole.
Figures 12B, 12C:
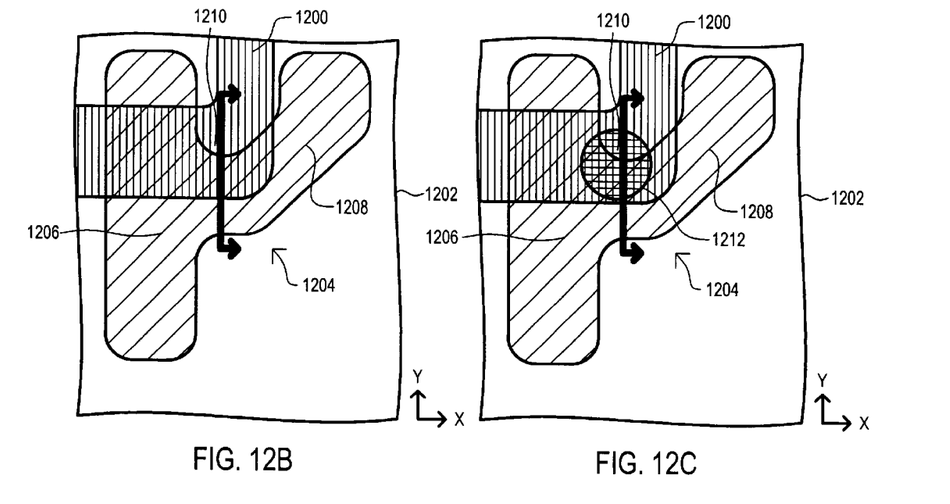
Figure 13A:
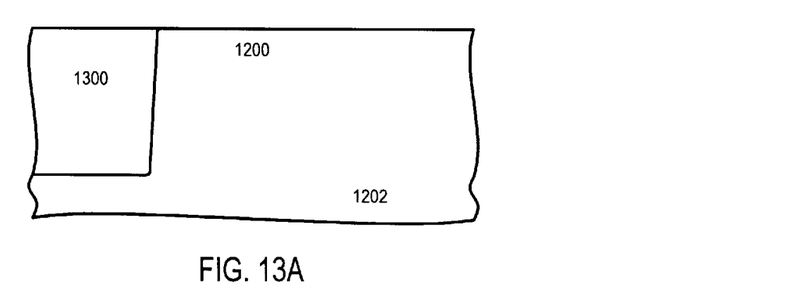
FIGS. 13A to 13C are side cross sectional views of a contact structure formed according to the method shown in FIGS. 12A to 12C.
Figure 13B:
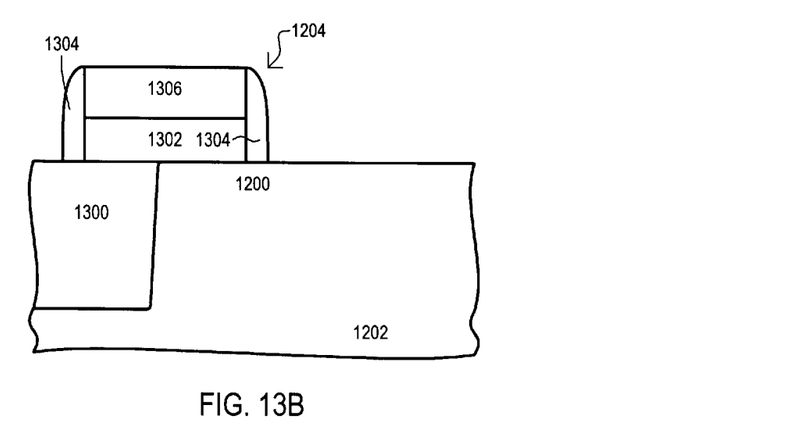
Figure 13C:
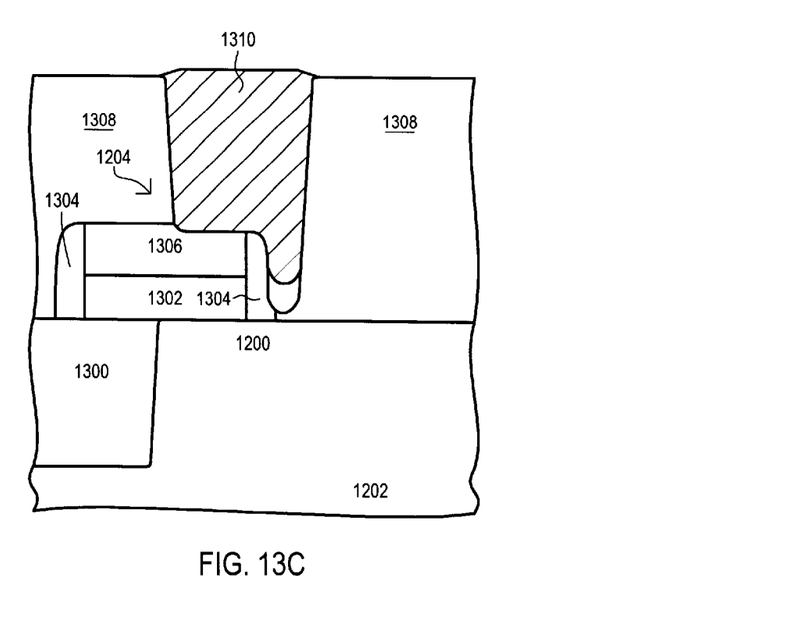

A second conventional example of a mask set and contact formation method are shown in FIGS. 11, 12A to 12C and 13A to 13C. FIG. 11 is an example of a mask set that may be used to form a "cactus" contact hole. FIGS. 12A to 12C are top plan views illustrating a semiconductor structure that may be manufactured with the mask set of FIG. 11. FIGS. 13A to 13C are side cross-sectional views corresponding to the views of FIGS. 12A to 12C.

A cactus contact hole can be a contact hole formed adjacent to a cactus shaped intermediate structure. An intermediate structure can potentially extend into a contact hole location, reducing overall contact area. A cactus structure can include a first portion that extends in one direction and a second portion that extends from the first portion at an angle. A cactus contact derives its name from the shape of the intermediate structure, which can, in some configurations, resemble a Saguaro-type cactus. A first portion may correspond to a cactus body while a second portion may correspond to a cactus arm.

A cactus contact hole can be a contact hole that is formed between a body portion and an arm portion of a cactus shaped intermediate structure.

FIG. 11 shows three overlapping mask patterns, each distinguished by a particular hatching pattern. The masks can include an "active" mask 1100, a gate layer mask 1102, and a contact hole mask 1104. A gate layer mask 1102 includes a first section 1106 that extends in the vertical direction of FIG. 11 and a second section 1108 that extends at an angle to a first section 1106.

As shown by FIG. 11, a contact hole mask 1104 can be situated to form a contact hole generally between a first portion 1106 and a second portion 1108.

FIGS. 12A to 12C show a sequence of steps in the formation of a contact hole with the masks of FIG. 11. In particular, FIG. 12A shows an active area 1200 formed in a substrate 1202. FIG. 12A also includes an arrowed line that indicates the side cross sectional view of FIG. 13A.

FIG. 13A shows a substrate 1202 as well as an active area 1200. An active area 1200 may be surrounded by isolation regions 1300. Isolation regions 1300 may be formed with STI or LOCOS methods, to name but two possible examples.

FIG. 12B shows a "cactus' gate layer structure 1204 formed over a substrate 1202 according to gate layer mask 1102. In the particular example of FIGS. 12A to 12C, a gate layer structure 1204 is misaligned in the positive Y direction, and further, has a high CD.

It is noted that "cactus" gate layer structures can be particularly desirable as such structures can be used in many common circuit elements, such as a complementary metal-oxide-semiconductor (CMOS) inverter, for example. In such an arrangement, a first portion 1206 can form commonly connected gates of an n-channel MOS transistor and a p-channel MOS transistor. A second portion 1208 can be connected to a node that drives the commonly connected gates.

A cactus shaped gate layer structure 1204 can include a "high CD" corner 1210 formed by an intersection of a first portion 1206 and a second portion 1208. In a high CD corner 1210, due to undesirable lithographic and etch effects, it may be difficult to remove all material indicated by a mask. This can allow such material to extend into an adjacent contact hole location, reducing contact area.

FIG. 12B also includes an arrowed line that indicates the side cross sectional view of FIG. 13B.

FIG. 13B shows a gate layer structure 1204. A gate layer structure 1204 may include a gate layer 1302, sidewalls 1304, and a top isolation 1306. Such an arrangement may allow for self-aligned contact structures.

FIG. 12C shows a contact hole 1212 that may be formed according to contact hole mask 1104. As shown by FIG. 12C, misalignment between a contact hole 1212 and an underlying gate layer structure 1204 and/or a high CD can result in undesirable reductions in contact area. FIG. 12C can also illustrates how available contact area (i.e., portions of active area 1200 in the high CD corner 1210) may not be used efficiently. In particular, in the example of FIG. 12C, unused contact area may be available above contact hole 1212 in the positive Y direction. FIG. 12C also includes an arrowed line that indicates the side cross sectional view of FIG. 13C.

FIG. 13C shows a contact hole 1212 that may be formed through an interlayer insulation layer 1308. As noted above, and as shown in FIG. 13C, conventional approaches can result in contact with high resistance or contacts that fail. FIG. 13C shows a contact that fails. One example of a failure is a contact etch that may fail to expose active area 1200. Another possible failure is that a conductive contact material 1310 may fail to make contact with active area 1200. (A conductive contact material 1310 is not shown in FIG. 12C.)

Thus, conventional approaches to forming a contact hole adjacent to a cactus gate layer structure can be adversely affected by misalignment variation and/or CD variations and/or corner and other lithographic effects.

It would be desirable to arrive at some way of forming contact holes adjacent to intersecting portions of an underlying layer, such as a cactus gate layer structure, that can provide for greater contact area.

SUMMARY OF THE INVENTION

The present invention includes embodiments having a "cactus" contact hole that may be formed with a contact hole mask. A cactus contact hole mask may include at least one corner extension that can result in greater contact area. More particularly, a contact hole mask may have a generally rectangular structure having four corner extensions. A contact hole mask may also include side indents.

According to one aspect of the embodiments, a semiconductor structure can include an active area that extends in a first direction. A cactus contact hole may be formed with a contact hole mask having a generally rectangular shape. A longer dimension of the rectangular shape may extend in the first direction.

According to another aspect of the embodiments, cactus structures may be formed that are intermediate to a contact hole. Each cactus structure may include a structure corner formed by the intersection of a first portion and a second portion. A structure corner may be formed by an intermediate layer mask having at least one corresponding corner indent.

According to another aspect of the embodiments, first portions of intermediate cactus structures may form gates for complementary insulated gate field effect transistors, such as metal-oxide-semiconductor (MOS) transistors.

According to another aspect of the embodiments, second portions of adjacent intermediate cactus structures may face one another for a compact static random access memory cell arrangement.

DETAILED DESCRIPTION OF THE EMBODIMENTS

Various embodiments will now be described in conjunction with a number of diagrams. The embodiments set forth lithography masks, manufacturing methods, and structures for contacts that, conventionally, may be more susceptible to failure due to variations in features size and mask misalignment. Particular embodiments show mask sets, manufacturing methods, and an integrated circuit structure that includes a contact hole formed adjacent to an intermediate "cactus-shaped" structure.

Figure 1:
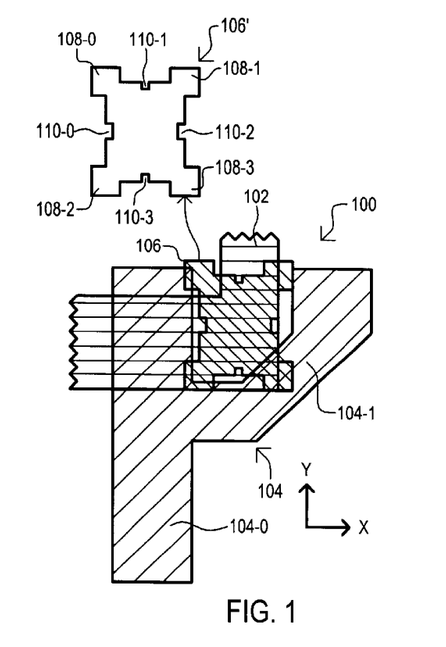
FIG. 1 is a top plan view of a mask set according to one embodiment.

Referring now to FIG. 1 a top plan view shows a mask set according to one embodiment. It is understood that a mask set can represent selected masks of a manufacturing process that may include many other masks. Such other masks may be used before and/or between and/or after the particular masks shown. Thus, the term "mask set" is should not be construed as a complete mask set for forming an integrated circuit device Further, while masks of the embodiment may be used in a photolithographic process, this should not be construed as limiting the invention to one particular type of lithography process. It is also understood that while a "mask" may represent a pattern that may eventually be formed in a "reticle," or the like, a mask may also be pattern that is electronically stored in a system. Such systems may include, without limitation, various beam patterning systems that raster an image according to pattern, such as ion beam and electron beam (e-beam) systems, to name but two examples.

A mask in a mask set according to the various embodiments may be a "positive" mask or a "negative" mask according to a particular patterning process. In most conventional cases, the type of mask can be dependent upon the type of "resist" used.

FIG. 1 shows a mask set 100 that includes an underlying pattern mask 102, an intermediate structure mask 104, and a contact hole mask 106. An underlying pattern mask 102 can define a region to which a contact hole may be formed. As but one example, an underlying pattern mask 102 may define "active" areas in a semiconductor substrate. Active areas can form source, drain and channel regions for transistors. As another example, an underlying pattern mask 102 may define an underlying deposited conductive layer to which a contact hole may be formed.

It is understood that an underlying pattern mask 102 that defines active areas may be an etch mask for processes that form trench isolation structures (such as shallow trench isolation, as one example). Alternatively, for processes that form isolation structures according to local-oxidation-silicon-of-silicon (LOCOS), an underlying target pattern mask 102 may be a nitride etch mask. Still further, if an underlying pattern mask 102 defines an underlying interconnect pattern, it may be an interconnect layer etch mask.

An intermediate structure mask 104 may be a mask that can define a structure situated between a top opening of a contact hole and an underlying pattern formed by underlying pattern mask 102. Such an intermediate structure may reduce contact area by extending into a contact hole location. A particular intermediate structure mask 104 can form a "cactus" pattern. A cactus pattern may have a first section 104-0 that can be conceptualized as forming a cactus "trunk," and a second section 104-1 that can be conceptualized as forming a cactus "arm."

An intermediate structure mask 104 may define a gate layer in a process that forms insulated gate field effect transistors. In such an arrangement, an intermediate structure mask 104 can be a polycrystalline silicon (poly) gate etch mask.

A contact hole mask 106 may define a contact hole that can be aligned between the first section 104-0 and a second section 104-1 of the intermediate structure mask 104. In the view of FIG. 1, the general shape of a contact hole mask 106 is repeated to the upper left of the mask set 100 as item 106', to more clearly show various features of a contact hole mask according to one embodiment.

A contact hole mask 106 can have a shape that, for a given lithography and etch process, forms a contact hole that can extend over a greater area in one particular direction than conventional approaches that includes contact hole mask patterns that are essentially square in shape.

In one particular arrangement, at least one corner of a contact hole can be extended away from the central portion of the contact, by adding one or more mask pattern units (serifs) beyond a conventional square shape. In the particular view of FIG. 1, the contact hole pattern 106' has "add serifs" added to all four corners of an essentially rectangular shape. As a result, a contact hole pattern 106' can include corner extensions 108-0 to 108-3. Corner extensions (108-0 to 108-3) are believed to counteract undesirable lithography and/or etch effects present in some conventional processes having contact holes patterns with essentially square corners.

The embodiment of FIG. 1 also shows a contact hole pattern 106' that may have a rectangular shape oriented so as to take advantage of an underlying target pattern shape. For example, in FIG. 1, an underlying target pattern mask 102 between a cactus body 104-0 and a cactus arm 104-1 can be longer in a Y direction than in an X direction. Consequently, a contact hole pattern 106 may have an underlying rectangular shape that is longer in the Y direction than in the X direction.

A contact hole pattern 106' may also include one or more side indents. In the particular example of FIG. 1 side indents (110-0 to 110-3) can be formed in each side of a contact hole pattern 106' with one or more "remove serifs." As will be explained in more detail with reference to FIGS. 7A to 7C, side indents may allow adjacent patterns to be situated closer to one another than adjacent patterns that do not include such side indents.

Figure 2A:
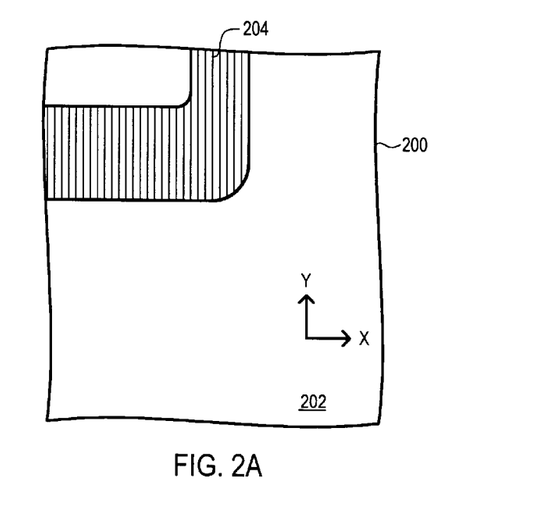
FIGS. 2A to 2C are top plan views showing a contact structure and method of forming a contact structure according to one embodiment.
Figure 2B:
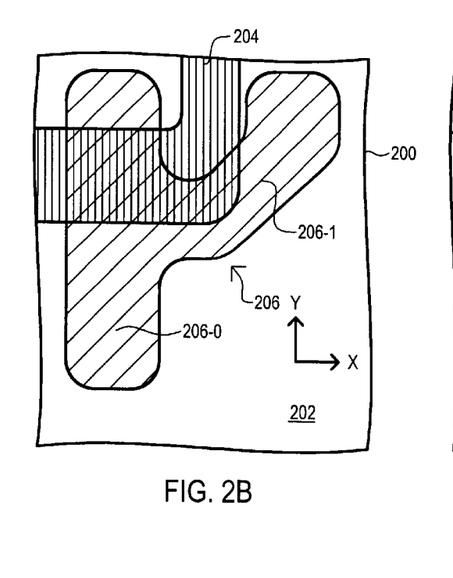
Figure 2C:
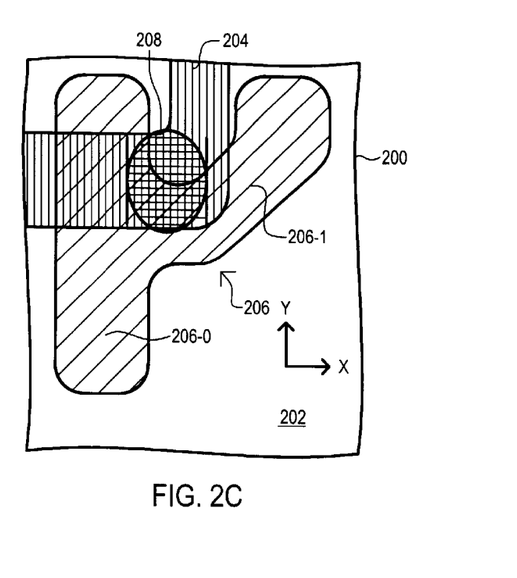

FIGS. 2A to 2C are a series of top plan views that show a method of manufacture and a semiconductor device that can be fabricated with a mask set, such as that show in FIG. 1.

Referring now to FIG. 2A, a semiconductor device includes a substrate 200 on which may be formed an isolation region 202 and an active area 204. The extents of an active area 204 may be determined by underlying pattern mask 102. In one particular arrangement, source, drain, and channel regions of an insulated gate field effect transistor may be formed in an active area 204.

As shown to FIG. 2B, a contact forming process according to one embodiment may continue by forming an intermediate structure 206. In the particular arrangement of FIG. 2B an intermediate structure 206 can have dimensions determined by an intermediate structure mask 104. As such, an intermediate structure 206 may, in particular embodiments, have a cactus shape. A cactus shape may include a first (cactus body) portion 206-0 and a second (cactus arm) portion 206-1. In the particular example of FIG. 2B, intermediate structure 206 is purposely shown misaligned with respect to a positive Y direction and includes a high CD. Thus, the arrangement of FIGS. 2A to 2C presents a situation where conventional contact formation approaches and structures may fail to provide adequate contact area.

An intermediate structure 206 can cover a portion of active layer 204. In one particular arrangement, an intermediate structure 206 can form a polysilicon gate for at least one transistor. More particularly, an intermediate structure 206 can form commonly connected gates of complementary transistors.

A contact forming process may further include forming a contact hole with a contact hole mask that includes one or more of the features of contact hole mask 106/106'. In the particular arrangement of FIG. 2C, a contact hole 208 can have dimensions determined by contact hole mask 106/106'. As such, a contact hole 208 may have an oval shape that is longer in the Y direction and the X direction. A contact hole 208 may further include larger areas than conventional approaches having essentially perpendicular corners.

Greater extents in a direction corresponding to a direction of an underlying layer (the Y direction in the example of FIGS. 2A to 2C) and/or larger contact area resulting from one or more corner extensions may provide more contact area than a conventional contact structure.

In this way, according to one embodiment, a contact hole mask 106 can include one or more corner extensions (108-0 to 108-3). Such corner extensions (108-0 to 108-3) can form a contact hole 208 having more area than a contact hole formed with a mask having right angle corners. Further, a contact hole mask 106 can form a contact hole between two adjacent portions of an intermediate structure 206 that is longer in one direction than another, and oriented so as to overlap active area 204 regions that may remain unexposed by conventional contact mask shapes.

It is understood that while the contact hole 208 illustrated has a particular shape, such a particular shape should not be construed as being limited thereto. Contact hole shapes resulting from a contact hole mask 106/106' may vary according to particular materials and equipment used in the formation of the contact hole.

Figures 3, 4A:
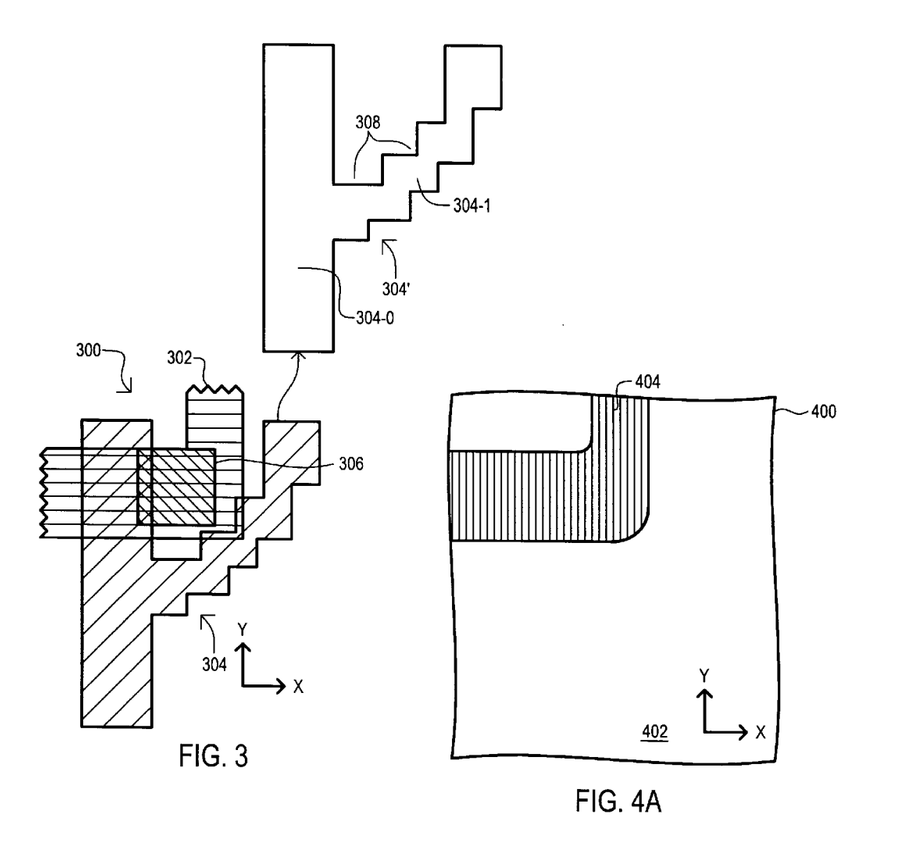
FIG. 3 is a top plan view of a mask set according to a second embodiment.
FIGS. 4A to 4C are top plan views showing a contact structure and method of forming a contact structure according to a second embodiment.

Referring now to FIG. 3, a top plan view is shown illustrating a mask set according to a second embodiment. A mask set according to the embodiment of FIG. 3 can be subject to the same variations and alternate constructions discussed in conjunction with embodiment of FIG. 1.

FIG. 3 shows a mask set 300 that includes an underlying pattern mask 302, an intermediate structure mask 304, and a contact hole mask 306. An underlying pattern mask 302 can define a region to which a contact hole may be formed, and may be subject to the variations and alternate constructions discussed with respect to underlying pattern mask 102 of FIG. 1.

An intermediate structure mask 304 may be a mask that defines a structure intermediate to a contact hole top opening and an underlying pattern formed by underlying pattern mask 302. The particular intermediate structure mask 304 of FIG. 3 can form a "cactus" pattern. In the view of FIG. 3, the general shape of an intermediate structure mask 304 is repeated above mask set 300 as item 304', to more clearly show its various features.

In one arrangement, an intermediate structure mask 304' may have a first section 304-0 that can be conceptualized as forming a cactus "trunk" and a second section 304-1 that can be conceptualized as forming a cactus "arm." An intermediate structure mask 304' may also include one or more corner indents 308. A corner indent 308 may be formed by one or more "drop" serifs that subtract from a cactus pattern proximate to where a first section 304-0 intersects a second section 304-1.

One or more corner indents 308 may result in an intermediate structure that provides more contact area than conventional approaches. More preferably, corner indents 308 can be formed in what would be a high CD corner in a conventional mask. Such a high CD corner may be formed where a first section 304-0 intersects a second section 304-1 at an angle. More particularly, such an intersection may be at an acute angle.

In addition, corner indents can provide a way of controlling a resulting shape of an intermediate structure over conventional approaches that may include an angled line.

Figure 4B:
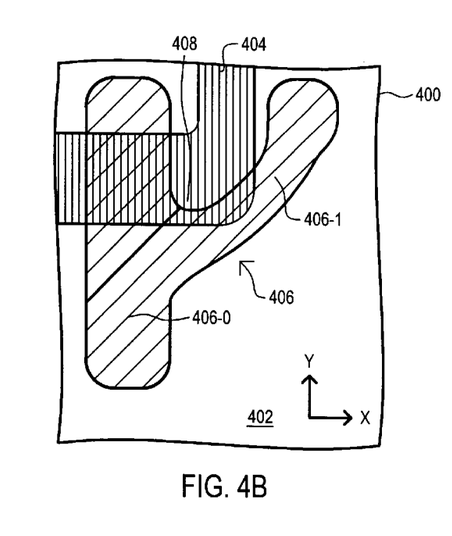
Figure 4C:
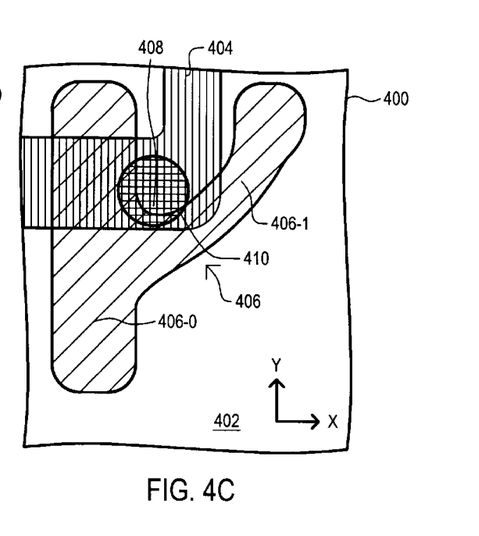

FIGS. 4A to 4C show a series of top plan views of semiconductor device fabricated with a mask set, such as that show in FIG. 3. Thus, FIGS. 4A to 4C can represent one embodiment of semiconductor manufacturing process and a resulting structure.

Referring now to FIG. 4A, a contact forming process can include forming an isolation region 402 and an active area 404 in a substrate 400. The extents of an active area 404 may be determined by an underlying pattern mask 402. In one particular arrangement, source, drain and channel regions of an insulated gate field effect transistor may be formed in an active area 404.

A contact forming method may continue by forming an intermediate structure 406. In the particular arrangement of FIG. 4B, an intermediate structure 406 can have dimensions determined by an intermediate structure mask 304/304'. As such, an intermediate structure 406 may have a cactus shape that includes a first (cactus body) portion 406-0 and a second (cactus arm) portion 406-1. In the particular example of FIG. 4B, an intermediate structure 406 is purposely shown misaligned with respect to a positive Y direction and includes a high CD. Thus, the arrangement of FIGS. 4A to 4C presents a situation where conventional contact formation approaches and structures may fail to provide adequate contact area.

An intermediate structure 406 can cover a portion of an active layer 404. An intermediate structure 406 can take the various forms discussed in conjunction with intermediate structure 206.

Due to corner indents 308 in an intermediate structure mask 304/304', a resulting intermediate structure 406 may expose more active area 404 in a corner 408 than conventional approaches. Such additional active area may result in greater contact area.

FIGS. 4A to 4C may also show how indents may control the shape of a resulting structure. In particular, a conventional cactus arm, such as that shown as 1208 in FIGS. 12A to 12C, can be formed with a mask having straight angled edges. Such a conventional cactus arm can be wider than that of FIGS. 4A to 4C which can include indents on both sides of a mask section 304-1.

A contact forming process may further include forming a contact hole. In the particular arrangement of FIG. 4C, a contact hole 410 can have a conventional shape that can be essentially square. However, an intermediate structure 406 may expose more active area 404 than conventional approaches. Thus, even though a conventional contact hole 410 could be used, additional contact area may be achieved over conventional methods.

In this way, according to a second embodiment, an intermediate structure mask 304/304' can have a first section 304-0, and second section 304-1 that intersects the first section 304-0 at an angle. An intermediate structure mask 304 can further include one or more corner indents 306 proximate to a junction of a first and second section (304-0 and 304-1). An intermediate structure 406 formed with an intermediate structure mask 304/304' can include a corner 408 that may expose more area of an underlying region, such as an active area 404, than conventional processes having masks that do not include such corner indents.

Figure 5:
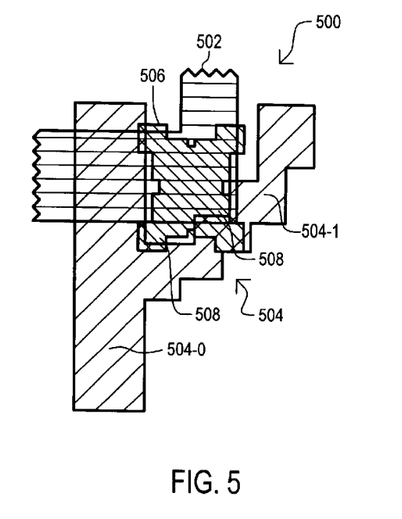
FIG. 5 is a top plan view of a mask set according to a third embodiment.

Referring now to FIG. 5, a top plan view shows a mask set according to a third embodiment. A mask set according to FIG. 5 can be subject to the same variations and alternate constructions discussed in conjunction with the embodiment of FIG. 1.

FIG. 5 shows a mask set 500 that includes an underlying pattern mask 502, an intermediate structure mask 504, and a contact hole mask 506. An underlying pattern mask 502 can define a region to which a contact hole may be formed, and may be subject to the variations and alternate constructions as mask 102 of FIG. 1.

An intermediate structure mask 504 can define a structure situated between a contact hole top opening and an underlying pattern formed by underlying pattern mask 502. The particular intermediate structure mask 504 may form a "cactus" pattern, such as that shown as item 304 in FIG. 3.

An intermediate structure mask 504 may have a first section 504-0 that can be conceptualized as forming a cactus "trunk" and a second section 504-1 that can be conceptualized as forming a cactus "arm." An intermediate structure mask 504 may also include one or more corner indents 508. As in the case of intermediate structure mask 304 of FIG. 3, a corner indent 508 may be formed by one or more "drop" serifs that subtract from a cactus pattern proximate to where a first section 504-0 intersects a second section 504-1.

Corner indents 508 may be arranged to correspond to a subsequently formed contact hole. As but one example, corner indents 508 may provide more area along a direction where a contact hole is longer. More particularly, a contact hole may be longer in one direction (e.g., the Y direction), and corner indents 508 may subtract from a conventional pattern in the same direction.

In addition, or alternatively, a contact hole may expose more area over conventional contact holes. In such a case, corner indents 508 may remove portions of a conventional pattern that can be situated below such additional area. More particularly, a contact hole may be formed with a pattern that includes one or more corner extensions. Portions of an intermediate structure mask that might conventionally be situated below such corner extensions may be subtracted from by a corner indent 508.

A contact hole mask 506 may define a contact hole that can be aligned between a first section 504-0 and a second section 504-1 of the intermediate structure mask 504. A contact hole 506 may include one or more of the various features discussed in conjunction with contact hole mask 106 of FIG. 1. For example, a contact hole mask 506 may include one or more corner extensions, and/or one or more side indents, and/or have a generally rectangular shape oriented to take advantage of an underlying pattern formed by underlying pattern mask 502.

In one a particular arrangement, a contact hole mask 506 may have a generally rectangular shape, four corner extensions, and four side indents. Such a shape may advantageously create greater contact area when used with an intermediate structure mask 504 having corner indents.

Figure 6A:
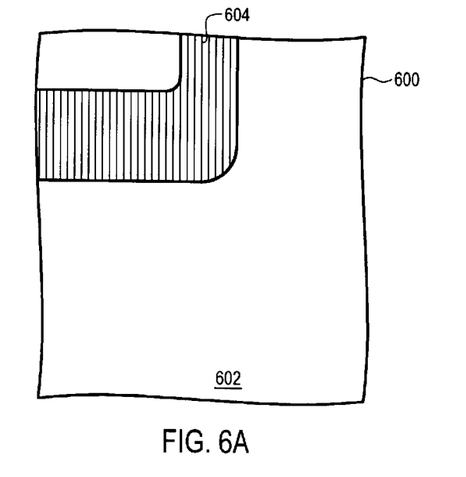
FIGS. 6A to 6C are top plan views showing a contact structure and method of forming a contact structure according to a third embodiment.
Figure 6B:
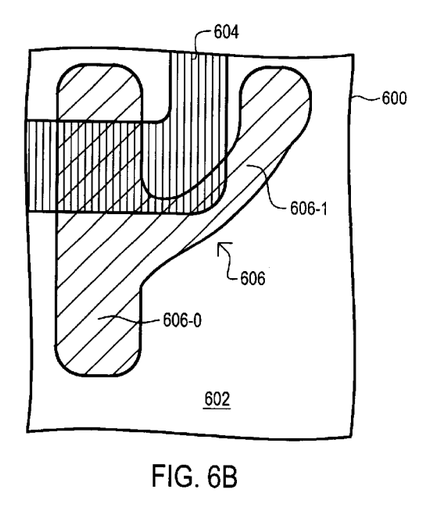
Figure 6C:
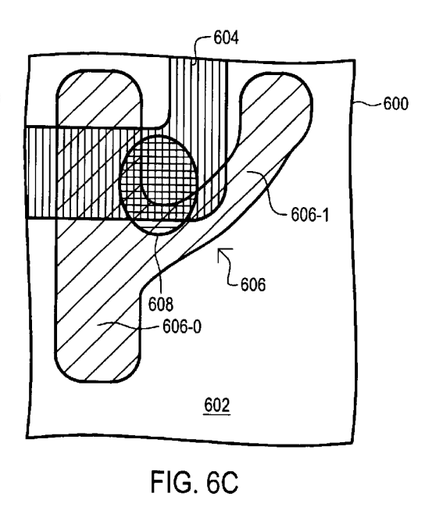

FIGS. 6A to 6C are a series of top plan views that show a method of manufacture and a semiconductor device that can be fabricated with a mask set, such as that show in FIG. 5.

Referring now to FIG. 6A, a semiconductor device includes a substrate 600 on which may be formed an isolation region 602 and an active area 604. The extents of an active area 604 may be determined by an underlying pattern mask 502. Isolation region 602 and active area 604 may be subject to the variations discussed in conjunction with the previously described embodiments.

An intermediate structure 606 may be formed according to an intermediate structure mask 504. Thus, an intermediate structure 606, may, in particular embodiments, have a cactus shape that includes a first (cactus body) portion 606-0 and a second (cactus arm) portion 606-1. In the particular example of FIG. 6B, intermediate structure 606 is purposely shown misaligned with respect to a positive Y direction and with a high CD. Thus, the arrangement of FIGS. 6A to 6C presents a situation where conventional contact formation approaches and structures may fail to provide adequate contact area.

An intermediate structure 606 can be subject to the variations and alternate constructions described in conjunction with intermediate structures 206 and 406.

A contact forming process according to FIGS. 6A to 6C may further include forming a contact hole 608 with a contact hole mask that includes one or more of the features of contact hole mask 506. As such, a contact hole 608 may have an oval shape that is longer in one direction than another. In addition, or alternatively, a contact hole 608 may further include larger areas than conventional approaches that include contact hole masks having essentially perpendicular corners.

In this way, according to a third embodiment, an intermediate structure 606 may be formed with an intermediate structure mask 504 having corner indents that expose larger portion of an underlying pattern, such as an active area 604 and/or corner indents that correspond to corner extensions in a contact hole mask. Further, a contact hole 608 may be formed with a contact hole mask 506 that includes at least one corner extension and/or a side indent. In addition, or alternatively, such a contact mask 506 may have a generally rectangular shape oriented to the direction of an underlying pattern, such as an active area 604.

The various embodiments set forth above have shown the formation and structure of a contact. However, the teachings set forth herein may be applied to form particularly advantageous circuit structures.

As was noted above, one application of a cactus shaped gate layer structure is in the formation of complementary insulated gate field effect transistors having commonly connected gates. Such a structure may form a complementary metal-oxide-semiconductor (CMOS) inverter, or various other CMOS logic circuits, such as NAND, NOR, XNOR and XOR gates. The various embodiments can contribute to increased contact area (and hence lower contact resistance) in such circuits.

It is noted that there are other, more complex circuits where there is a need for lower contact resistance. One such circuit is a CMOS latch. A CMOS latch can include cross-coupled CMOS inverters, and may be used in a variety of applications, including storage registers and the like. However, one particularly useful applications is as a portion of a six transistor (6-T) static random access memory (SRAM) cell.

SRAM cells are typically repeated in large numbers in an array. It is desirable to form such cells in as small an area as possible, in order to make the manufacture of such devices more cost effective. However, corner and/or edge effects, as well as other undesirable patterning and etch results, can make it difficult to form such SRAM cells with cactus type contacts.

Contact area in a memory cell may be increased by forming larger contacts. Conventionally, however, larger contacts may lead to larger memory cell size.

For example, it may difficult to form cells with such contacts at gate lengths less than 0.30 microns ($\mu$m) conventionally without undesirably increasing memory cell size. However, by forming contacts according to the above-described embodiments it can be possible to form SRAM cells with such contacts at even smaller features sizes: For example, 0.28 $\mu$m gate lengths. One particular example is shown in FIGS. 7A to 7C and FIG. 8.

Figure 7A:
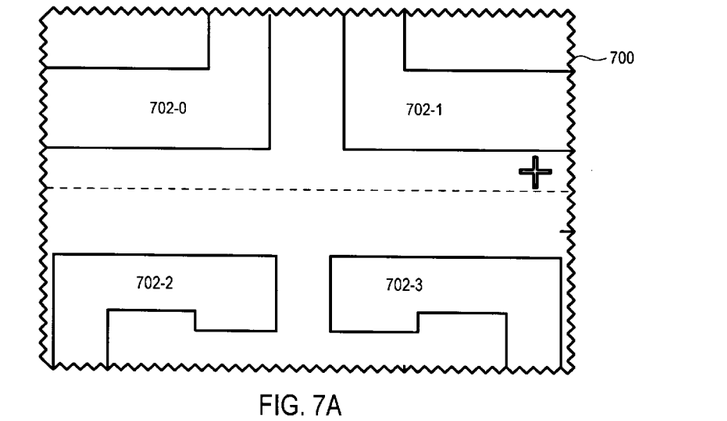
FIGS. 7A to 7C are top plan views of a mask set according to a fourth embodiment.
Figure 7B:
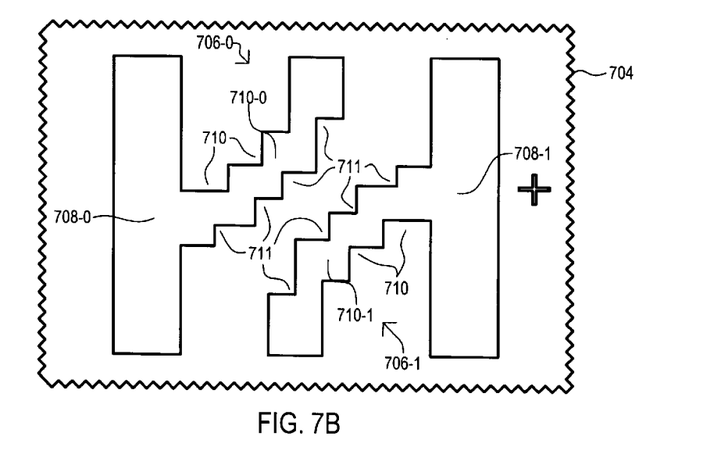
Figure 7C:
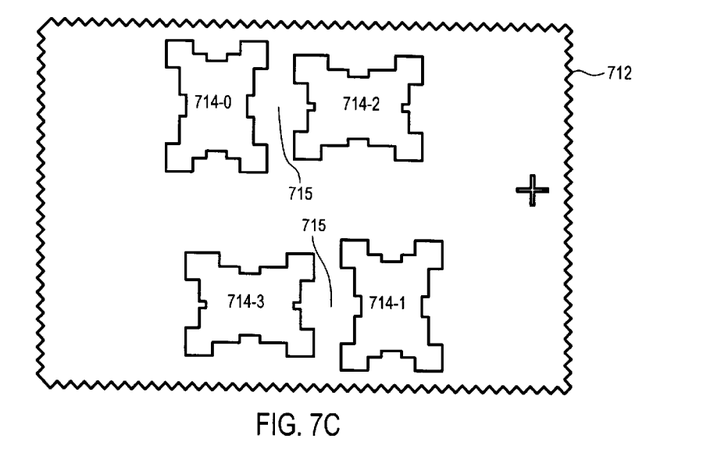

FIGS. 7A to 7C shown a sequence of masks that may be used to form a portion of a 6-T SRAM cell. FIG. 7A shows an active area mask 700. An active area mask 700 can include four active regions 702-0 to 702-3. Active regions 702-0 and 702-1 can correspond to transistors of a first conductivity type, while active regions 702-2 and 702-3 can correspond to transistors of a second conductivity type.

FIG. 7A also shows a dashed line that can represent a substrate portion of different conductivity type. Further, an arbitrarily situated alignment mark in the shape of a "+" is shown in FIGS. 7A to 7C to indicate the alignment of the masks with respect to one another.

FIG. 7B shows a gate layer mask 704. A gate layer mask 704 may include two cactus shaped patterns 706-0 and 706-1. Each cactus shaped pattern (706-0 and 706-1) may include a first section (708-0 and 708-1) and a second section (710-0 and 710-1) that extends from a corresponding first section (708-0 and 708-1). A cactus shaped pattern (706-0 and 706-1) may also include at least one corner indent 710.

In one particular arrangement, first sections (708-0 and 708-1) can form commonly connected gates of complementary insulated gate field effect transistors. Further, second sections (710-0 and 710-1) of one cactus shaped pattern (706-0 and 706-1) may extend toward a first section (708-1 and 708-0) of the other cactus shaped pattern (706-0 and 706-1). Such an arrangement can allow for advantageous placement of contacts for cross-coupling transistors with one another.

Cactus shaped patterns (706-0 and 706-1) may also include opposing side indents 711. Opposing side indents 711 may allow resulting cactus shaped structures to be placed closer to one another than structures formed with conventional masks having straight opposing sides.

FIG. 7C shows a contact hole mask 712. A contact hole mask 712 can include at least one contact hole pattern that is aligned between a first section (708-0 and 708-1) and a corresponding second section (710-0 and 710-1) of a corresponding gate layer mask 704. The particular arrangement of FIG. 7C includes four contact hole patterns (714-0 to 714-3). A contact hole pattern (714-0 to 714-3) may include one or more of the following: A corner extension, a side indent, or a generally rectangular shape that is aligned with the direction of an active region (702-0 to 702-3) in a corresponding active area mask 700.

In the particular arrangement of FIG. 7C, each contact hole pattern (714-0 to 714-3) has a generally rectangular shape, and includes four corner extensions and four side indents. Contact hole patterns 714-0 and 714-1 are oriented in the direction of active regions 702-0 and 702-3, respectively.

Further, in the arrangement of FIG. 7C adjacent contact hole patterns (714-0/714-2 and 714-3/714-1) may have opposing side indents. Such an arrangement may allow for smaller spacings 715 than conventional approaches that do not include such indents.

Figure 8:
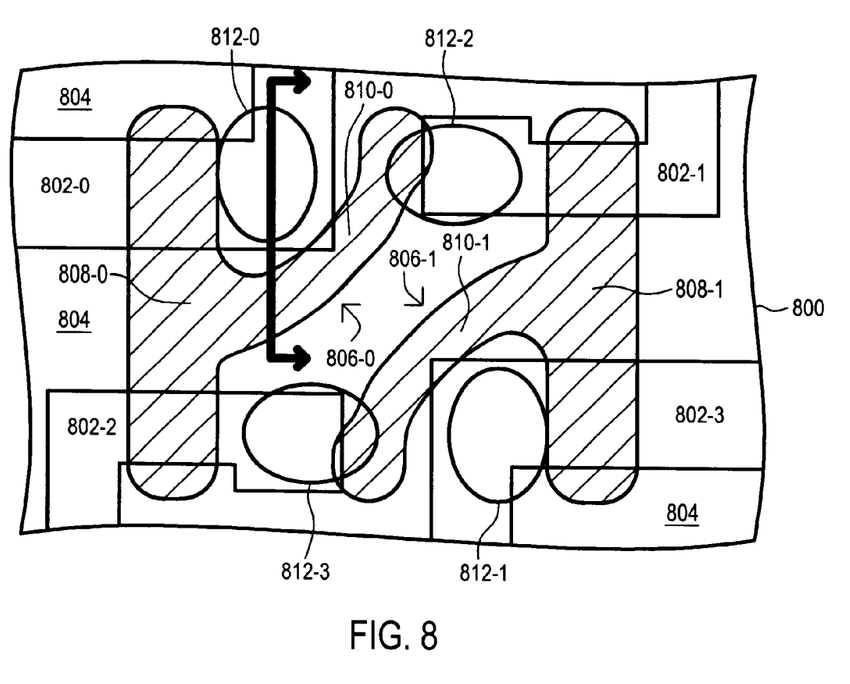
FIG. 8 is a top plan view of a memory cell structure according the fourth embodiment.

Referring now to FIG. 8, a top plan view shows a portion of a memory cell structure that may be formed with the mask set shown in FIGS. 7A to 7C. A memory cell portion according to FIG. 8 can be formed in a substrate 800 that includes active areas of a first conductivity type 802-0/802-1 and active areas of a second conductivity type 802-2/802-3. Active areas (802-0 to 802-3) may be separated from one another by isolation areas 804.

A gate layer mask (such as 704) can result in two cactus gate structures 806-0 and 806-1. Gate structures 806-0 and 806-1 can include first portions 808-0 and 808-1 and opposing second portions 810-0 and 810-1. In one particular arrangement, first portions (808-0 and 808-1) can form commonly connected gates for transistors of complementary conductivity types. Second portions (810-0 and 810-1) can provide common gate connections for the commonly connected gates. Opposing second portions (810-0 and 8101) can provide for a compact cell arrangement.

FIG. 8 also shows the formation of four contact holes 812-0 to 812-3. Contact hole 812-0 may be formed between first and second portions 808-0 and 810-0. Contact hole 812-1 may be formed between first and second portions 808-1 and 810-1. Thus, the arrangement of FIG. 8 illustrates one aspect of the present invention that can enable the formation of a compact SRAM cell with contact holes (810-0 and 810-1) that might, conventionally, result in undesirably high contact resistance.

In FIG. 8, contact hole 812-2 can be formed between second and first portions 810-0 and 808-1, while contact hole 812-3 can be formed between first and second portions 808-0 and 810-1. Contact hole 812-2 may provide a common connection between a second portion 810-0 and active region 802-1. Similarly, contact hole 810-3 may provide a common connection between second portion 810-1 and active regions 802-2.

In this way, a mask set, such as that set forth in FIGS. 7A to 7C, may be used in method of forming an SRAM cell that can produce an advantageously compact cell arrangement, such as that shown in FIG. 8.

Figure 9A:
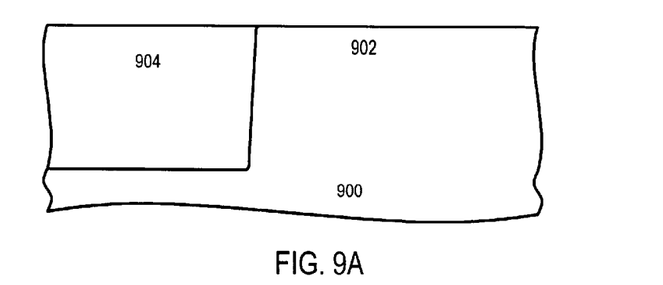
FIGS. 9A to 9C are side cross sectional views a semiconductor structure according to the fourth embodiment.
Figure 9B:
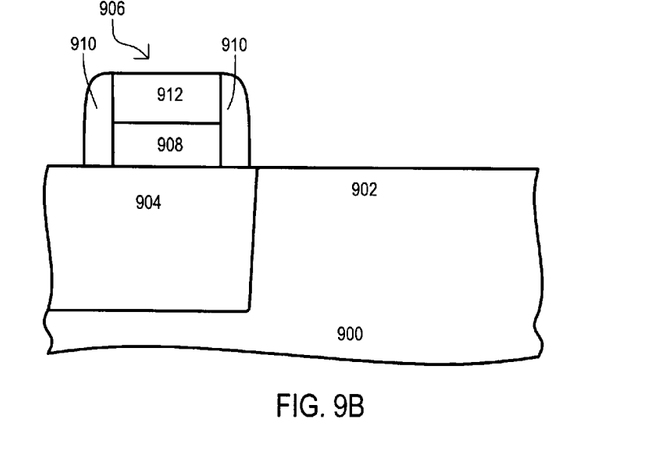
Figure 9C:
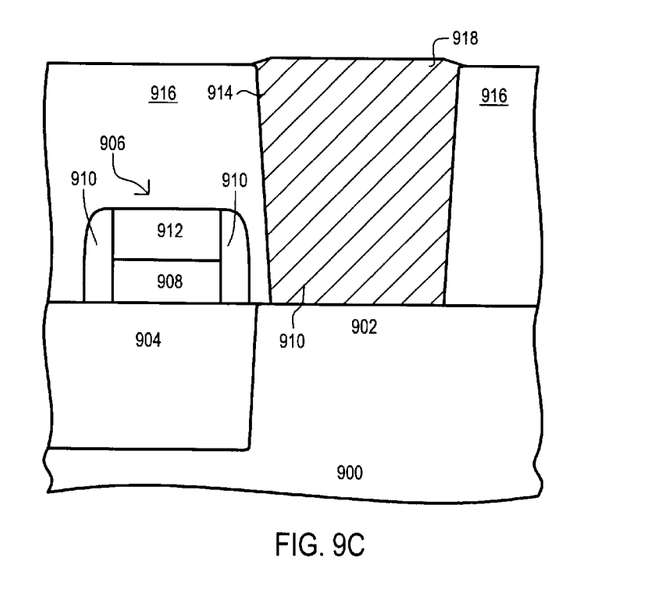

FIGS. 9A to 9C shown side cross-sectional views of a semiconductor device that may be manufactured with a mask set such as that set forth in FIGS. 7A to 7C. In particular, FIGS. 9A to 9C show a contact hole area designated by an arrowed line in FIG. 8.

FIG. 9A shows a substrate 900 that includes an active area 902. An active area 902 may be surrounded by isolation regions 904. Isolation regions 904 may be formed with STI or LOCOS methods, to name but two possible examples.

FIG. 9B shows a gate layer structure 906. A gate layer structure 906 may include a gate layer 908, sidewalls 910, and a top isolation 912. Such an arrangement may allow for self-aligned contact structures.

FIG. 9C shows a contact hole 914 that may be formed through an interlayer insulation layer 916. FIG. 9C shows how a contact hole (such as 812-0) formed with a mask having a generally rectangular shape and/or corner extensions may expose a larger contact area than a conventional approach. FIG. 9C can also show how a cactus gate structures (such as 806) formed with a mask having corner indents may provide more available active area for a contact. A conductive contact material 918 may be formed within a contact hole 914 and make contact with an active area 902. (A conductive contact material 918 is not shown in FIG. 8.)

It is understood that while the various particular embodiments have been set forth herein, methods and structures according to the present invention could be subject to various changes, substitutions, and alterations without departing from the spirit and scope of the invention. Accordingly, the present invention is intended to be limited only as defined by the appended claims.

What is claimed is:

1. A method, comprising:

forming a contact hole with a contact hole mask having a generally rectangular shape with at least one side indent and four corners, each corner including a corner extension, the contact hole being proximate to a structure corner formed by an intersection of a first intermediate structure portion and a second intermediate structure portion.

2. The method of claim 1, wherein:

the contact hole mask includes four sides, each side including at least one side indent.

3. The method of claim 1, wherein:

the structure corner is formed by an intermediate structure mask having a first section that intersects a second section at a structure mask corner, the structure mask corner including corner indents.

4. The method of claim 1, wherein:

the first intermediate structure portion and second intermediate structure portion comprise polysilicon.

5. A method, comprising:

forming an intermediate structure with an intermediate layer mask having a first section and a second section extending from the first section at an acute angle to form a mask corner, the mask corner including at least one corner indent; and forming a contact hole with a contact hole mask having at least one side indent.

6. The method of claim 5, wherein:

the intermediate structure comprises polysilicon.

7. The method of claim 6, wherein:

the intermediate structure includes a first portion formed with the first section of the intermediate layer mask, the first portion including a gate for an insulated gate field effect transistor (IGFET) of a first conductivity type and a gate for an IGFET of a second conductivity type.

8. The method of claim 5, wherein:

the mask corner includes a plurality of corner indents.

9. The method of claim 5, further including:

the intermediate structure includes a first portion formed with the first section of the intermediate layer mask and a second portion formed with the second section of the intermediate layer mask; and forming a contact hole between the first portion and the second portion.

10. The method of claim 9, wherein:

the contact hole is formed with a contact hole mask having at least one corner extension.

11. A method of forming an integrated circuit, comprising the steps of:

forming a contact hole with a contact hole mask having at least one corner extension and a side with a side indent, the contact hole being proximate to a structure corner formed by an intersection of a first intermediate structure portion and a second intermediate structure portion.

* * * * *